(12) United States Patent
Mitani et al.

(10) Patent No.: US 7,084,046 B2
(45) Date of Patent: Aug. 1, 2006

(54) METHOD OF FABRICATING SOI WAFER

(75) Inventors: Kiyoshi Mitani, Annaka (JP); Isao Yokokawa, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 81 days.

(21) Appl. No.: 10/495,988

(22) PCT Filed: Oct. 31, 2002

(86) PCT No.: PCT/JP02/11349

§ 371 (c)(1),
(2), (4) Date: May 18, 2004

(87) PCT Pub. No.: WO03/046993

PCT Pub. Date: Jun. 5, 2003

(65) Prior Publication Data

US 2005/0014346 A1  Jan. 20, 2005

(30) Foreign Application Priority Data

Nov. 29, 2001 (JP) ............................ 2001-364981

(51) Int. Cl.
*H01L 21/30* (2006.01)
(52) U.S. Cl. .................. 438/459; 257/E21.568
(58) Field of Classification Search ................ 438/455, 438/458, 459; 257/E21.568
See application file for complete search history.

(56) References Cited

U.S. PATENT DOCUMENTS

| | | | |
|---|---|---|---|
| 5,882,987 A | 3/1999 | Srikrishnan | |
| 5,985,728 A | 11/1999 | Jennings | |
| 6,140,210 A * | 10/2000 | Aga et al. ................... | 438/458 |
| 6,323,108 B1 * | 11/2001 | Kub et al. ................... | 438/458 |
| 6,323,109 B1 * | 11/2001 | Okonogi ...................... | 438/459 |
| 6,326,285 B1 * | 12/2001 | Behfar et al. ................ | 438/455 |
| 6,403,450 B1 * | 6/2002 | Maleville et al. ............ | 438/471 |
| 6,455,399 B1 * | 9/2002 | Malik et al. ................. | 438/460 |
| 6,806,171 B1 * | 10/2004 | Ulyashin et al. ............. | 438/492 |
| 2001/0046746 A1 * | 11/2001 | Yokokawa et al. ......... | 438/311 |
| 2002/0022344 A1 * | 2/2002 | Kang et al. .................. | 438/459 |

(Continued)

FOREIGN PATENT DOCUMENTS

EP   0 843 344 A1   5/1998

(Continued)

OTHER PUBLICATIONS

Stanley Wolf and Richard N. Tauber, Silicon Processing For The VLSI Era, 1986. Lattice Press, vol. 1, pp. 303-308.*

(Continued)

*Primary Examiner*—Michael Lebentritt
*Assistant Examiner*—Stanetta Isaac
(74) *Attorney, Agent, or Firm*—Oliff & Berridge PLC

(57) ABSTRACT

After completion of annealing for bonding of the base wafer 1 and bond wafer 2, the bond wafer 2 is thinned to a first thickness suitable for ion implantation, and boron is ion-implanted to thereby form a high-boron-concentration layer 10. A second thinning step based on selective etching is then carried out while using the high-boron-concentration layer 10 as an etch stop layer. This is successful in providing a method of fabricating an SOI wafer which is suppressed both in intra-wafer uniformity of the firm thickness and in inter-wafer uniformity of the film thickness even when a required level for the thickness of the SOI layer is extremely small.

26 Claims, 13 Drawing Sheets

U.S. PATENT DOCUMENTS

2004/0102021 A1* 5/2004 Sawyer et al. .............. 438/456
2004/0224482 A1* 11/2004 Kub et al. ................. 438/458

FOREIGN PATENT DOCUMENTS

JP     A 2-278766     11/1990
JP     A 6-302790     10/1994

OTHER PUBLICATIONS

Maszara et al. "Epi-less bond-and-etch-back silicon-on-insulator by MeV ion implantation", Appl. Phys. Lett. 58(24), Jun. 17, 1991, pp. 2779-2781.

Hobart et al. "Fabrication of SOI substrates with ultra-thin Si layers", Electronics Letters, Jun. 11, 1998, vol. 34, No. 12, pp. 1265-1267.

Unno et al. "Thin-SOI Process Using Bonding and Etch-back Method without Epitaxial Growth", Jpn. J. Appl. Phys. vol. 35 pp. 969-972, Part 1, No. 2B, Feb. 1996, pp. 969-972.

Godbey et al. "A $Si_{0.7}Ge_{0.3}$ strained-layer etch stop for the generation of thin layer undoped silicon", Appl. Phys. Lett. 56 (4), Jan. 22, 1990, pp. 373-375.

Chang et al. "Selective Etching of SiGe on SiGe/Si Heterostructures", J. Electrochem. Soc., vol. 138, No. 1, Jan. 1991, pp. 202-204.

* cited by examiner (a)

(b)

(a)

(b)

(c)

(d)

(e)

(a)

(b)

(c)

METHOD OF FABRICATING SOI WAFER

TECHNICAL FIELD

This invention relates to a method of fabricating an SOI wafer.

BACKGROUND ART

There are general trends in mobile communication such as using cellular phones or the like to handle high-frequency signal of several-hundred-MHz, and this raises needs for semiconductor devices having desirable high-frequency characteristics. For example, semiconductor devices such as CMOS-IC and high-voltage-resistance IC use so-called SOI wafer configured so that a silicon oxide film insulating layer is formed on a silicon single crystal substrate (also referred to as base wafer, hereinafter), and further thereon another silicon single crystal layer is formed by stacking as an SOI (Silicon on Insulator) layer. For the case where this is used for semiconductor devices for high-frequency use, it is necessary to use a high-resistivity silicon single crystal as the base wafer in order to reduce high-frequency loss.

One representative method of fabricating the SOI wafer is known as a bonding method. In the bonding method, a first substrate which serves as the base wafer, and a second substrate which serves as an SOI layer in which devices will be formed (also referred to as bond wafer, hereinafter) are bonded while placing a silicon oxide film in between, and the bond wafer is then thinned to a predetermined thickness to as thin as a film, to thereby make the bond wafer into the SOI layer.

The following methods are publicly known as those for thinning the bond wafer.

① A method in which hydrogen ion is implanted to the bonding surface (referred to as first main surface) of the bond wafer so that a high-hydrogen-concentration layer is formed at a predetermined depth, the bond wafer is bonded to the base wafer, and the bond wafer is then delaminated at the high-hydrogen-concentration layer (so-called Smart Cut (registered trademark)Process).

② A porous silicon layer is formed by anodization treatment on the bonding surface side of the bond wafer, and a silicon epitaxial layer is formed by vapor-phase epitaxy on the porous silicon layer. The bond wafer is then bonded to the base wafer on its silicon-epitaxial-layer side, and the bond wafer is removed by grinding from the side opposite to the bonding surface to a depth short of the porous silicon layer, or by delamination by jetting a liquid to the porous layer, the residual porous silicon layer is then selectively etched to thereby leave the silicon epitaxial layer as the SOI layer (so-called ELTRAN (registered trademark) Process).

③ A silicon epitaxial layer heavily doped with boron is grown by vapor-phase epitaxy on the bonding surface (referred to as first main surface) side of the bond wafer. The bond wafer is then bonded to the base wafer on its silicon-epitaxial-layer side, and the bond wafer is removed by grinding halfway from the side opposite to the bonding surface. Lastly, the residual portion of the bond wafer is selectively etched based on difference in the boron concentration up to a level of the high-boron-concentration silicon epitaxial layer, to thereby leave the silicon epitaxial layer as the SOI layer (so-called boron etch stop process).

The aforementioned methods, however, suffers from drawbacks as described below. In Smart Cur Process ①, as shown in FIG. 12A, an SOI wafer 50' (reference numeral 1 denotes a base wafer, and 3 denotes a silicon oxide film) obtained after the delamination has an SOI layer 7' of which surface having a damaged layer 8 ascribable to the ion implantation, so that roughness of the delamination plane per se is larger than that of mirror-finished surface of a Si wafer or an ordinary product grade. Conventionally, the damaged layer 8 has been mirror-finished by subjecting the surface of the delaminated SOI layer 7' to mirror polishing having a small polishing depth (generally referred to as touch polishing, where mechano-chemical polishing is adopted). This process results in, as shown in FIG. 12B, a distribution of the film thickness t of the obtained SOI layer of 1.5 to 2 nm or around, in terms of intra-wafer standard deviation σ1. It is also found that, as shown in FIG. 12C, wafers in a wafer lot having the same specification have a distribution of the film thickness t (t1, t2, t3) of approximately 3 nm or larger in terms of inter-wafer standard deviation σ2.

These variations in the film thickness are inevitable in view of technical level of mirror polishing at present, and of no serious problem so far as the thickness of the SOI layer remains at approximately 100 nm or above. There are, however, accelerating trends in micronization and higher integration of CMOS-LSI or the like, which is a major application field of the SOI wafer, so that even a film of 100 nm thick or around, which had been noted as a ultra-thin film up to several years ago, is now no more surprising so much. At present, average film thickness required for ultra-thin-film SOI layer is far thinner than 100 nm, which is reduced to several ten nanometers (20 to 50 nm, for example), and even reduced in some cases to as small as 10 nm or around. In this case, the above-described level of non-uniformity in the film thickness accounts for as much as 10 to several ten percents of the target average film thickness, so that it is a matter of course that this directly results in quality variation of semiconductor devices using the SOI wafer, and lowering in the production yield.

Next, in the ELTRAN process ②, the finally obtained SOI layer is thinned by etch back of the porous Si layer, where a problem resides in that the SOI layer contains, in the surficial portion thereof, a high density of crystal defect such as stacking fault produced in the process of forming an epitaxial layer on the porous Si layer. It is obvious in this case that any trial of touch polishing for removing the crystal defects in the surficial portion will result in the same problem with that in the Smart Cut Process ①.

It is inevitable in the boron etch stop process ③, as shown in FIG. 13A, to adopt process steps in which an epitaxial layer 11 heavily doped with boron is formed on the bond wafer 2, bonding annealing is carried out so as to bond the silicon oxide film 3 to the base wafer 1, and the bond wafer 2 is then thinned by grinding and etch back. Because the bonding annealing is generally carried out at a temperature of as high as 1,000 to 1,300° C., as shown in FIG. 13B, the boron concentration profile in the vicinity of the interface of the epitaxial layer 11 is broadened and loses its sharpness, and this makes etch stop per se impossible. This inevitably requires lowering of the bonding annealing temperature to as low as 800 to 900° C., where another problem arises in that it is made impossible to attain a sufficiently large bonding strength, and that a lot of unbonded areas, called voids, are generated, and that the bond interface becomes more likely to be eroded in the etch back process.

It is therefore a subject of this invention to provide a method of fabricating an SOI wafer, which can suppress both of the intra-wafer uniformity of the firm thickness and the inter-wafer uniformity of the film thickness to an enough small level even when a required level for the thickness of the SOI layer is extremely small, and can suppress the quality variation and raise the production yield even when the SOI wafer is processed to obtain ultra-fine, highly integrated CMOS-LSI or the like.

DISCLOSURE OF THE INVENTION

In view of solving the above-described subject, a method of fabricating an SOI wafer is characterized in comprising:

a bonding step in which an insulating film is formed on a first main surface of at least either one of a first substrate and a second substrate which is composed of silicon single crystal, and the first substrate and the second substrate are bonded so as to oppose their first main surfaces while placing the insulating film in between;

a first thinning step for reducing the thickness of the second substrate so as to obtain an SOI layer having a first thickness;

an etch-stoppable, ion-implanted-layer forming step for forming an etch-stoppable, ion-implanted layer by ion implantation from the surface side of the SOI layer so as to make a concentration peak at a predetermined depth from the surface of the SOI layer; and a second thinning step for reducing the thickness of the SOI layer by selective etching it on the surface side thereof as viewed from an etch stop layer formed as being derived from the etch-stoppable, ion-implanted layer, so as to obtain the SOI layer having a second thickness smaller than the first thickness.

In the method of this invention, the bond wafer is etched back by selective etching making use of etching step layer formed as being derived from the etch-stoppable, ion-implanted layer in the last process step, i.e., in the second thinning step. An essential feature of this invention resides in the timing of carrying out the second thinning step based on selective etching. The conventional etch back typically adopts an etch stop layer such as a high-boron-concentration layer or the like formed before the bonding of a first substrate (base wafer) and a second substrate (bond wafer) while placing a silicon oxide film in between, whereas this invention forms the etch-stoppable, ion-implanted layer by ion implantation after the bonding step. More specifically, after the bonding step, the second substrate is thinned in the first thinning step to a first thickness suitable for the ion implantation, and the etch-stoppable, ion-implanted layer is formed by the ion implantation. The etch-stoppable, ion-implanted layer may be used as the etch stop layer without any modification, or may be used in a final form of the etch stop layer after being enhanced in the etching selectivity by an appropriate additional treatment. Anyway conditions for the ion implantation are adjusted so as to obtain a depth of concentration peak of the implanted ion adapted to the target thickness of the SOI layer.

Thus-formed, etch-stoppable, ion-implanted layer is no more causative of broadening of the concentration profile of the etching-selectivity-providing component contained in the etch-stoppable, ion-implanted layer due to thermal diffusion, even for the case where high-temperature annealing is necessary in the bonding step, because the bonding annealing proceeded under high temperatures has already finished, and this successfully maintains a sharp concentration profile. Because the depth of ion implantation in the formation of the etch-stoppable, ion-implanted layer can exactly be reproduced if only the ion implantation energy is controlled at constant, so that in-plane variation of the depth of concentration peak of the etching-selectivity-providing component can also be minimized. The succeeding second thinning step based on selective etching is therefore successful in obtaining an SOI layer having an excellent film thickness distribution not only on the intra-wafer basis but also on the inter-wafer basis, corresponding to the sharp concentration profile having a constant depth of the peak position.

Although a damaged layer may be produced in the surficial portion of the SOI layer during the ion implantation in the formation of the etch-stoppable, ion-implanted layer, thus-produced damaged layer can readily be removed by selective etching in the second thinning step. As a natural consequence, it is not always necessary to carry out the touch polishing of the first main surface of the SOI layer after completion of the second thinning step, and even for the case where the touch polishing is carried out, only a smaller polishing depth is necessary as compared with the conventional process, and this successfully suppresses any adverse effect on the uniformity in the film thickness.

In this invention, the etch-stoppable, ion-implanted-layer forming step may typically be a high-boron-concentration layer forming step in which boron ion is implanted from the surface side of the SOI layer to thereby form the etch-stoppable, ion-implanted layer as a high-boron-concentration layer. In this case, the high-boron-concentration layer acts as the etch stop layer in the second thinning step, and the portion of the SOI layer more closer to the surface than the etch stop layer is selectively etched based on difference in the boron concentration. Although the conventional etch back process formed the high-boron-concentration layer before bonding step of the first substrate (base wafer) and second substrate (bond wafer) while placing the silicon oxide film in between, the embodiment of this invention forms the high-boron-concentration layer by carrying out the ion implantation after the bonding step. More specifically, after the bonding step, the second substrate is thinned in the first thinning step to a first thickness suitable for the ion implantation, and boron ion is then implanted. Conditions for the ion implantation are adjusted so as to obtain a depth of boron concentration peak adapted to the target thickness of the SOI layer. The high-boron-concentration layer is excellent in the etching selectivity but is highly causative of diffusion by annealing since the boron is a light-weight element. On the contrary, this invention forms the high-boron-concentration layer after completion of the bonding annealing, so that there is no fear of broadening of the concentration profile due to thermal diffusion, and so that the SOI layer having an excellent thickness distribution can be obtained corresponding to a sharp boron concentration profile in which the peak depth is kept constant.

Between the high-boron-concentration layer forming step and the second thinning step, it is also allowable to anneal the SOI wafer in order to activate boron. For the case where such additional annealing is carried out in an annealing furnace based a heater-heating system, the annealing temperature is preferably limited to 750° C. or below. The annealing at a temperature exceeding 750° C. may be more likely to cause an excessive broadening-by-diffusion of the obtained boron concentration profile, and this ruins a meaning of carrying out the bonding annealing under high temperatures before the high-boron-concentration layer forming step. In contrast to this, the annealing in a temperature range of 750° C. or below, which is not causative of the excessive broadening as described in the above, can be carried out between the high-boron-concentration layer forming step and the second thinning step without any problem. On the contrary, for the case where the annealing is carried out in an RTA (Rapid Thermal Annealing) apparatus based on lamp heating or the like, the activation will be successful without causing the excessive broadening even if the temperature exceeding 750° C. is adopted, because the annealing time can extremely be shortened.

After the second thinning step, implanted boron ion remains in the obtained SOI layer at a high concentration. Although the residual boron can be used as a part of p-type dopant, for example, if unnecessary, an external-diffusion annealing is carried out so as to remove it by external diffusion. The annealing is preferably adjusted, for example, in the range of 900 to 1300° C., and is preferably carried out in an atmosphere of hydrogen gas, argon gas, or a mixed gas of these gasses.

In this invention, it is also allowable to proceed an oxygen diffusion step for allowing oxygen to diffuse towards the etch-stoppable, ion-implanted layer in the SOI layer, so as to raise oxygen concentration of the etch-stoppable, ion-implanted layer, to thereby obtain the etch stop layer in a form of a high-oxygen-concentration layer having an oxygen concentration higher than that of the peripheral area. That is, the etch-stoppable, ion-implanted layer is formed in an SOI layer by ion implantation, and the oxygen diffusion step for allowing oxygen to diffuse towards the etch-stoppable, ion-implanted layer is then carried out, to thereby form the etch stop layer having an oxygen concentration higher than that of the peripheral area. And then, at least a portion of the SOI wafer in contact with the etch stop layer is selectively etched based on difference in the oxygen concentration.

The high-oxygen-concentration layer in silicon (e.g., silicon oxide layer) shows a distinct etching selectivity over silicon having a low oxygen concentration under etching using an alkaline solution, and can certainly stop etching of the bonded silicon single crystal film.

The etch-stoppable, ion-implanted layer can be controlled in its ion distribution in the depth direction of implantation in a relatively desirable manner by controlling ion implantation energy. The implanted ion produces crystal defect (damaged layer) in the SOI layer formed by thinning the second substrate so as to have a first thickness. In the oxygen diffusion step, oxygen diffused towards the SOI layer having a first thickness is trapped by the crystal defect, to thereby form the etch stop layer. The etch stop layer herein will be such as having a sharp concentration profile having a constant depth of the peak position corresponding to ion implantation distribution of etch-stoppable, ion-implanted layer and thus distribution of the crystal defect. As a consequence, etch back of the SOI layer having a first thickness from the surface thereof to the etch stop layer (second thinning step) is successful in obtaining an excellent film thickness distribution not only on the intra-wafer basis but also on the inter-wafer basis. Adoption of the etch back is also successful in excluding, from the process, the touch polishing which has been a major cause for degrading the film thickness distribution of the SOI layer, or in reducing the polishing depth, and this largely contributes to improvement in the film thickness distribution.

The etch-stoppable, ion-implanted layer herein can readily form the damaged layer containing a high density of crystal defect which contributes to the oxygen trapping, when it is formed by using at least one ion selected from the ion groups consisting of hydrogen ion, rare gas ion, silicon ion and oxygen ion.

The above-described method of this invention is successful in ensuring uniformity in the film thickness of the SOI layer after the second thinning step of 0.4 nm or less, for example, on the basis of an intra-wafer standard deviation of the thickness. It is also successful in ensuring the uniformity of 2 nm or less on the basis of an inter-wafer standard deviation observed in the wafers having the same specification. As a consequence, the intra-wafer and inter-wafer variations in the film thickness can successfully be reduced to a level enough for allowing the practical use, even when the SOI layer is thinned to a second thickness of 50 nm or below, or ultra-thinned to as thin as 20 nm or below in the second thinning step.

In this invention, methods of thinning the second substrate (bond wafer) adoptable in the first thinning step typically include Smart Cut Process and ELTRAN process, for example. These methods per se are publicly known as explained in the above, where combination of these methods with this invention is more successful in intrinsically solving essential drawbacks of these methods described above in "BACKGROUND ART".

For the case Smart Cut Process is adopted, a delaminable ion-implanted layer is formed, prior to the bonding step, by implanting at least either one of hydrogen ion and rare gas ion from the first main surface of the second substrate so as to have a concentration peak at a predetermined depth from the first main surface of the second substrate in terms of depth ion implantation profile. The second substrate is then bonded to the first substrate, and a bonded silicon single crystal film intended for becoming the SOI layer is delaminated at the ion-implanted layer from the second substrate. This process is advantageous in that the second substrate after being delaminated from the SOI layer can be recycled for fabrication of the next SOI wafer. Although some damaged layer induced by the implantation of hydrogen ion or the like is produced in the surficial portion of the SOI layer (bonded silicon single crystal film) immediately after the delamination, such damaged layer can be removed without any problems by the selective etching in the second thinning step. It is no more necessary to carry out the touch polishing step, and this is also advantageous in considerably improving the film thickness distribution of the SOI layer as compared with the conventional process.

On the other hand, for the case where ELTRAN process is adopted, a porous silicon layer is formed on the first main surface side of the second substrate prior to the bonding step, and on the porous silicon layer, a silicon epitaxial layer intended for becoming the SOI layer is formed by vapor-phase epitaxy. The surface of the silicon epitaxial layer is then bonded to the first substrate. Thereafter, the silicon epitaxial layer intended for becoming the SOI layer is delaminated from the second substrate at the porous silicon layer, and the porous silicon layer remaining on the silicon epitaxial layer is removed by selective etching, to thereby form the SOI layer. As has already been described in the above, it is difficult to suppress the crystal defect and surface roughness of the SOI layer immediately after the selective etching of the porous silicon layer to as low as a sufficient level only by ELTRAN process, but combination with the succeeding second thinning step based on the selective etching is successful in sufficiently reducing these surface defects without adversely affecting the thickness distribution of the SOI layer.

BEST MODES FOR CARRYING OUT THE INVENTION

Best modes for carrying out the invention will be described below.

FIRST EMBODIMENT

Figure 1:
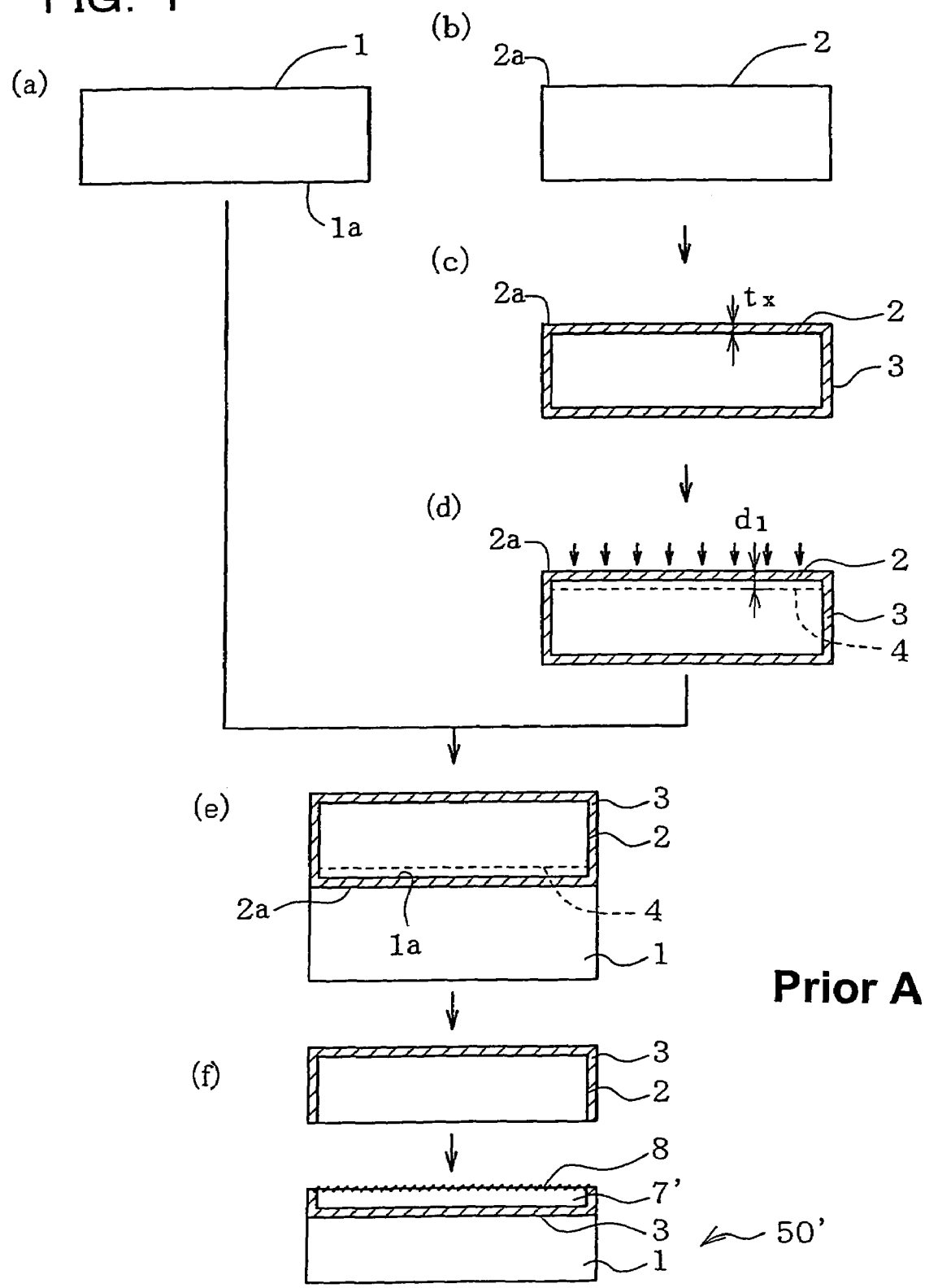
FIG. 1 is a drawing explaining fabrication process steps of an SOI wafer according to a first embodiment of this invention.

FIG. 1 is a drawing schematically explaining the method of fabricating an SOI wafer of this invention based on an exemplary case of using Smart Cut Process. First, a base wafer 1 (silicon single crystal wafer) as a first substrate shown in process step (a) and a bond wafer 2 (silicon single crystal wafer) as a second substrate shown in process step (b) are obtained. In the embodiment shown in FIG. 1, as shown in process step (c), a silicon oxide film 3 is formed as an insulating film on the surface of the bond wafer 2. The silicon oxide film 3 can typically be formed by thermal oxidation such as wet oxidation, where it is of course allowable to adopt other methods such as CVD (Chemical Vapor Deposition). Thickness of the silicon oxide film tx is typically set to a known value ranging from 50 nm to 2 μm or around. It is also allowable to use, in place of the silicon oxide film 2, an insulating film such as silicon nitride film or silicon oxynitride film.

Next, as shown in process step (d), the bond wafer 2 after the formation of the silicon oxide film 3 is irradiated by hydrogen ion beam and thereby a high-hydrogen-concentration layer (ion-implanted layer) 4 is formed at a predetermined depth from the main surface of the silicon single crystal wafer on the irradiation side. For the case where the average thickness of the SOI layer to finally be obtained (above-described second thickness) is set to 10 to 50 nm or around, the high-hydrogen-concentration layer 4 is preferably formed so that the peak hydrogen concentration is found at a position 100 to 1,000 nm deep from the surface of the bond wafer 2 in measurement of the depth profile of hydrogen concentration of the wafer. It is to be noted herein that depth d1 in the process step (d) corresponds to a sum of the thickness of the delaminated SOI layer (i.e., first thickness) and the thickness of the silicon oxide film 3.

For the purpose of ensuring an easy and smooth delamination, amount of implanted hydrogen ion (dosage) is preferably adjusted to $2\times10^{16}/cm^2$ to $1\times10^{17}/cm^2$. The dosage less than $2\times10^{16}/cm^2$ will fail in normal delamination, and exceeding $1\times10^{17}/cm^2$ will increase the process time due to an excessively increased dosage, and inevitably degrade the production efficiency. It is also allowable to carry out the ion implantation using, in place of hydrogen ion, any rare gas ions such as helium ion, or mixed ions of these species.

Next, the individual main surfaces of the base wafer 1 and bond wafer 2 are cleaned using a cleaning liquid, then as shown in process step (e), both wafers are stacked on the side the silicon oxide film 3 is formed, and bonded by annealing (delaminating annealing) at a temperature as low as 400 to 600° C. By the delaminating annealing, the bond wafer 2 causes delamination nearly at the position of concentration peak of the aforementioned high-hydrogen-concentration layer 4, and the residual portion on the base wafer 1 side will be the SOI layer 7' (this is the end of the first thinning step: the SOI wafer obtained after completion of the first thinning step is indicated by a reference numeral 50', hereinafter). It is to be noted that, in some cases, the delaminating annealing is omissible by raising the dosage, or preliminarily activating the surface to be bonded by plasma treatment.

The SOI layer 7' immediately after the delamination has, formed on the surface thereof, a damaged layer 8 ascribable to the ion implantation. This invention does not adopt the touch polishing for removing the damaged layer 8 as in the conventional process. This is because the damaged layer 8 will chemically be removed by the selective etching in the second thinning step described later. The second thinning step is successful in achieving an excellent distribution of the film thickness of SOI layer, and it can be said that it is even preferable to abandon the touch polishing which possibly degrades the distribution. The polishing is, however, not precluded from being carried out so far as the polishing depth is smaller than the etching depth in the selective etching. The bonding annealing is generally carried out at a temperature range as high as 1,000 to 1,300° C. in order to enhancing the bonding strength of the delaminated SOI wafer. Although this annealing can be carried out also as the external diffusion annealing of boron described later, the bonding annealing carried out prior to the selective etching in the second thinning step is successful in preventing erosion of the bonded interface in the selective etching.

Figure 2:
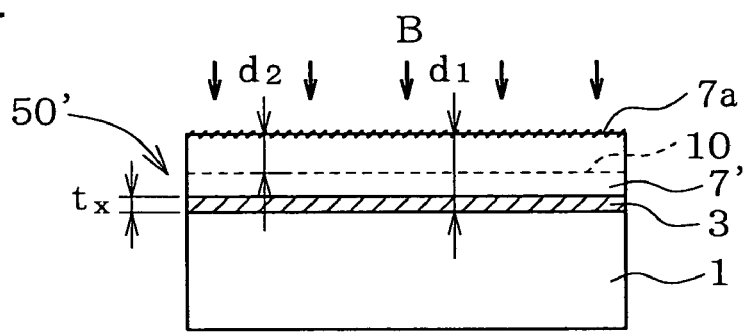
FIG. 2 is a drawing explaining the fabricating process steps as continued from FIG. 1.
Figure 2:
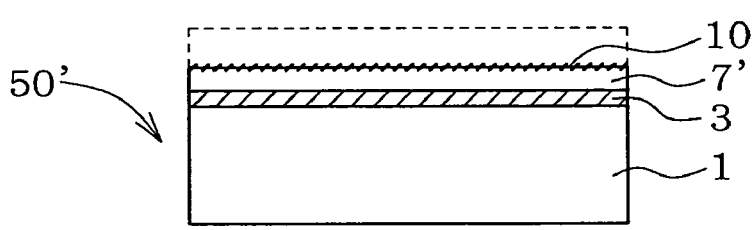
Figure 2:
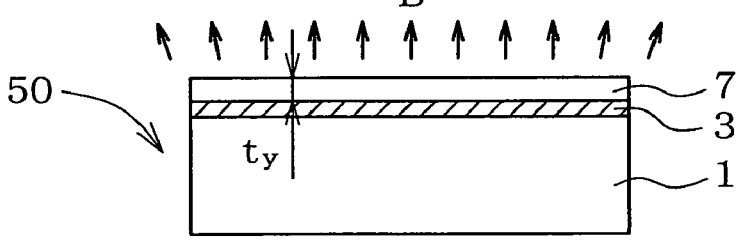
Figure 2:
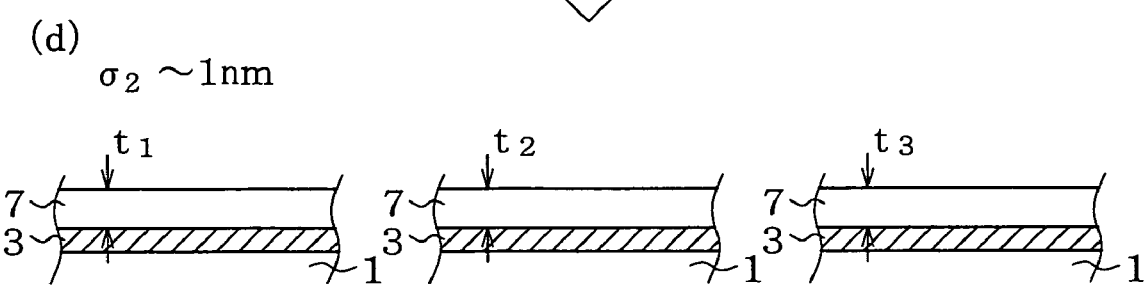

Next, as shown in process step (a) in FIG. 2, boron (B) ion is implanted into the SOI layer 7' of the SOI wafer 50' from a top surface 7a side of the SOI layer, to thereby form a high-boron-concentration layer 10 having a concentration peak at a predetermined depth d2 from the top surface 7a (high-boron-concentration-layer forming step). The concentration peak position refers to an etch stop position in the selective etching described later. Assuming now that the final target thickness of the SOI layer as ty, the concentration peak d2 of the high-boron-concentration layer 10 can be determined by:

$$d2 = d1 - ty - tx \qquad (1)$$

where d1 denotes peak position depth of hydrogen concentration in the first thinning step, and tx denotes thickness of the silicon oxide layer 3.

Absolute value of boron concentration at the peak position of the high-boron-concentration layer 10 is preferably fall within a range from $1\times10^{19}/cm^3$ to $1\times10^{20}/cm^3$. The absolute value of boron concentration at the peak position of the high-boron-concentration layer less than $1\times10^{19}/cm^3$ will result in only a poor etching selectivity, and consequently in a degraded etch stop performance, whereas the value exceeding $1\times10^{20}/cm^3$ will excessively increase the ion dosage and elongate the process time, and inevitably degrade the process efficiency.

For the case where the top surface 7a of the SOI layer 7' exposed to the ion implantation of boron is a delamination surface, the peak position of the high-boron-concentration layer 10 may vary assimilating its surface roughness (e.g., 5 nm or above on the basis of root mean square roughness (RMS) in an 1-μm-square measurement area). It is therefore preferable to carry out high-temperature annealing at 1,100 to 1,300° C. in a hydrogen gas or an inert gas such as argon gas, or in a mixed gas of these gases, prior to the ion implantation of boron, to thereby improve the surface roughness of the SOI layer 7' to be ion-implanted (e.g., 0.3 nm or less on the RMS basis). This type of annealing can be carried out also as the bonding annealing, and can be carried out not only in a heater-heating-type annealing furnace such as general batch-type vertical furnace and horizontal furnace, but also in a single-wafer-processing-type RTA apparatus which can complete the annealing within several seconds to several minutes or around using lamp heating or the like. It is still also allowable to carry out the high-temperature annealing after the topmost surficial portion of the delamination surface of the SOI layer 7' is etched off only by a depth just necessary for removal of the damage.

Next, as shown in process step (b) in FIG. 2, while using the high-boron-concentration layer 10 as the etch stop layer, the portion of the SOI layer 7' more closer to the surface than the etch stop layer 10 is selectively etched based on difference in the boron concentration, so as to reduce the thickness of the SOI layer to the second thickness smaller than the first thickness (second thinning step), to thereby obtain the SOI wafer 50 having the SOI layer 7 having a final thickness ty. The etching solution used herein is such as showing a sharp decrease in the etching performance against silicon or termination of etching, when the boron concentration varies from lower concentration side to higher concentration side across a certain critical concentration. A representative example is an aqueous ethylenediamine/pyrocatechol solution (e.g., mixture of ethylenediamine:pyrocatechol:water=17 cc:3 g:8 cc), which shows an excellent etching selectivity when used under heating at 100 to 110° C.

The high-boron-concentration layer 10 which serves as the etch stop layer is formed after the bonding annealing carried out at high temperatures, so that it can be subjected to the selective etching while keeping a sharp concentration profile unchanged. This is consequently successful in obtaining the SOI layer excellent in distribution of the film thickness not only on the intra-wafer basis, but also on the inter-wafer basis, corresponding to a sharp boron concentration profile having a constant depth of peak position. Any damaged layer 8 (FIG. 1) ascribable to the hydrogen ion implantation for delamination of the SOI layer can be removed by the etching without problems. More specifically, uniformity in the thickness of the resultant SOI layer 7 can be suppressed to as small as 0.4 nm or less on the basis of a standard deviation of the thickness observed in a single wafer, and as shown in action explanation (d), 2 nm or less on the basis of a standard deviation σ2 of the thickness t (=t1, t2, t3) observed in the wafers having the same specification. In particular, even for the case where the SOI layer 7 is ultra-thinned to 20 nm or below (e.g., 10 nm), it is made possible to reduce the intra-wafer and inter-wafer variations in the film thickness to a level enough for allowing the practical use.

Referring now to process step (b) in FIG. 2, implanted boron ion remains in the SOI layer 7' after the etching. Although the residual boron can be used as a part of a p-type dopant, it can also be removed, if unnecessary, by external diffusion under annealing in a hydrogen atmosphere (inert gas atmosphere such as argon gas also available) at 900 to 1,300° C., as shown in process step (c).

Figure 3:
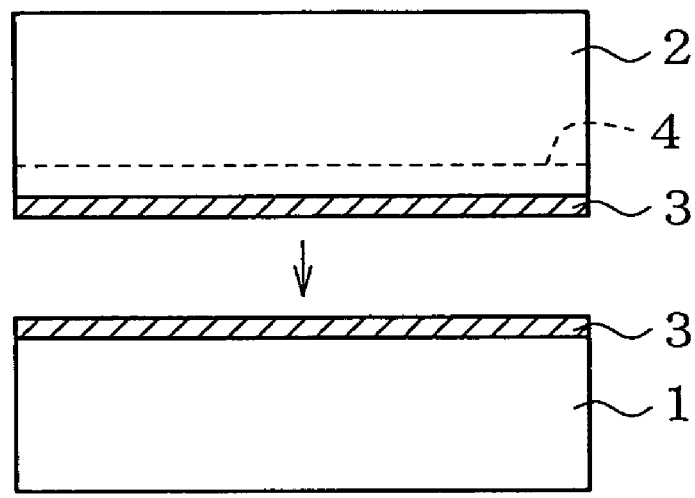
FIG. 3 is a drawing showing a first modified example of wafer bonding mode in Smart Cut Process.
Figure 3:
Figure 3:
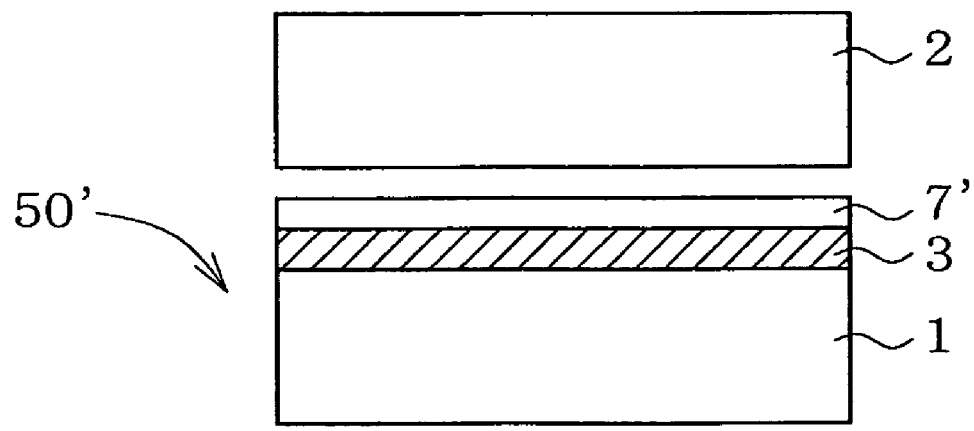
Figure 4:
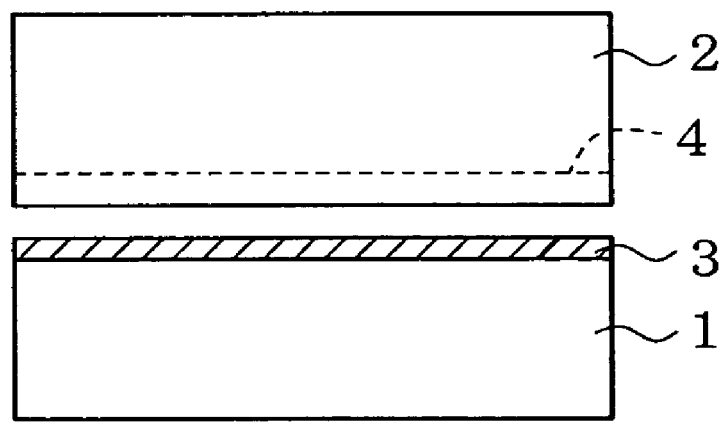
FIG. 4 is a drawing showing a second modified example of the same.
Figure 4:
Figure 4:
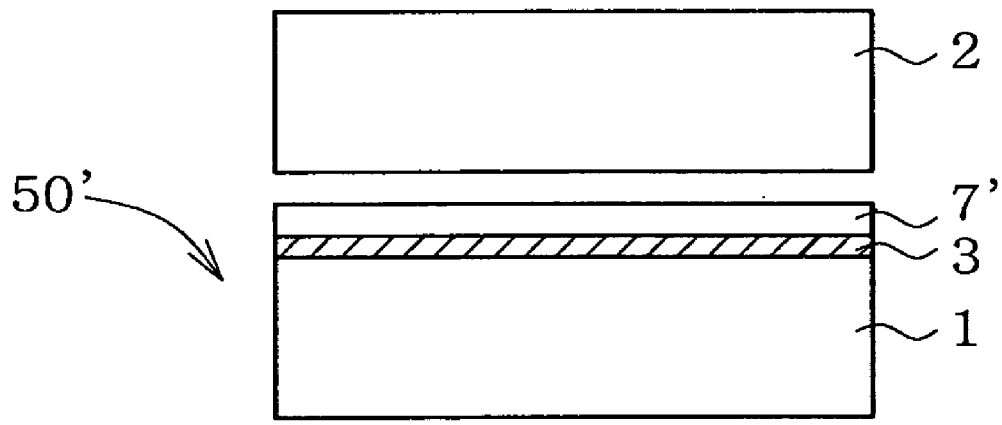

The embodiment of this invention has been described, where this invention is by no means limited thereto, where various modifications and improvements can be added without departing from the technical scope according to the description in the claims. For example, the first thinning step was exemplified by Smart Cut Process, but embodiments of Smart Cut Process are not limited to those shown in FIG. 1, and it is also allowable, as shown in process step (a) in FIG. 3, to form silicon oxide films 3, 3 on the bonding surfaces (first main surface) of both of the base wafer 1 and the bond wafer 2, or as shown in process step (a) in FIG. 4, to form the silicon oxide film 3 only on the base wafer 1 side. As shown in process step (b), both cases are successful in obtaining, after the delamination, the SOI wafer 50' similar to as shown in FIG. 1.

Figure 5:
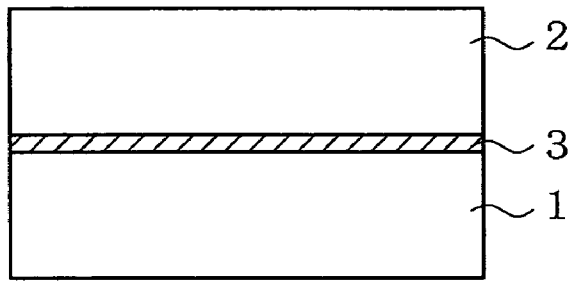
FIG. 5 is a drawing explaining process steps for an exemplary case where the first thinning step is carried out by grinding/polishing process.
Figure 5:
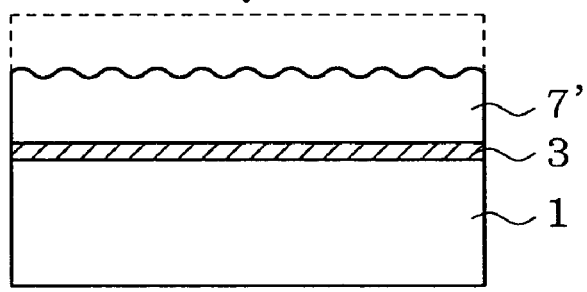
Figure 5:
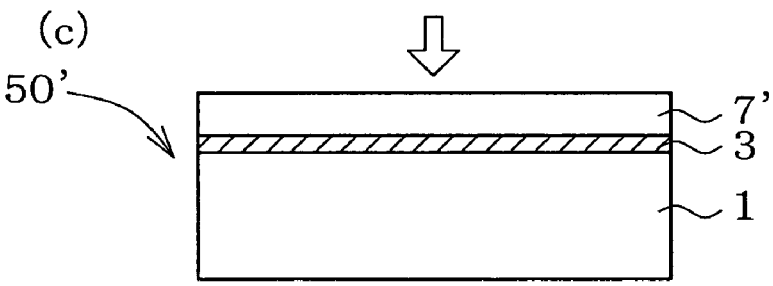
Figure 5:
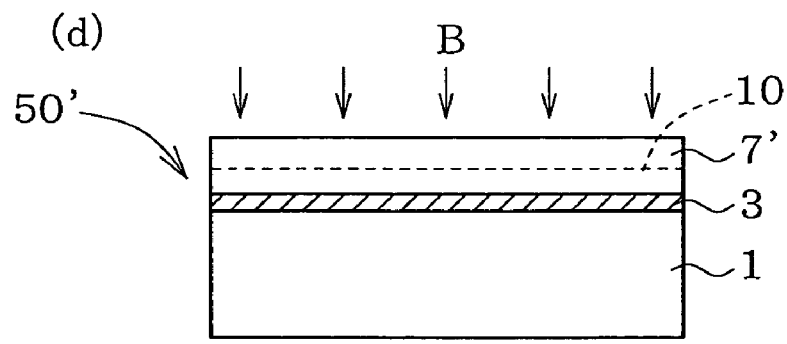
Figure 5:
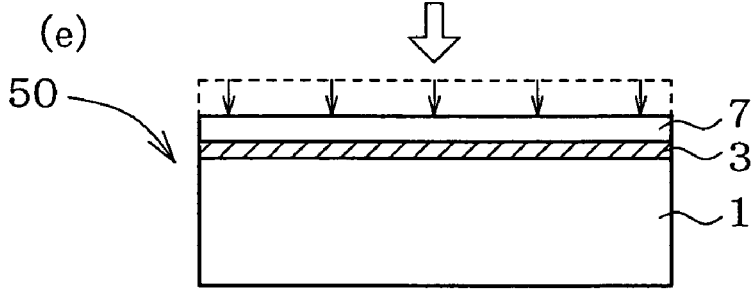

In place of Smart Cut Process, as shown in FIG. 5, it is also allowable to adopt a method in which the bond wafer 2 is ground or polished from the surface opposite to that having the silicon oxide film 3 formed thereon, to thereby reduce the thickness. That is, as shown in process step (a), the base wafer 1 and bond wafer 2 are subjected to bonding annealing, and then as shown in process step (b), the bond wafer 2 is mechanically ground typically using a surface grinder or the like, and as shown in process step (c), the surface is further smoothened by mechano-chemical polishing or additional vapor-phase etching called the PACE (Plasma Assisted Chemical Etching) process, to thereby obtain the SOI wafer 50' having the SOI layer 7'. The succeeding process steps (d) and (e) are same as those shown in FIG. 2.

Figure 6:
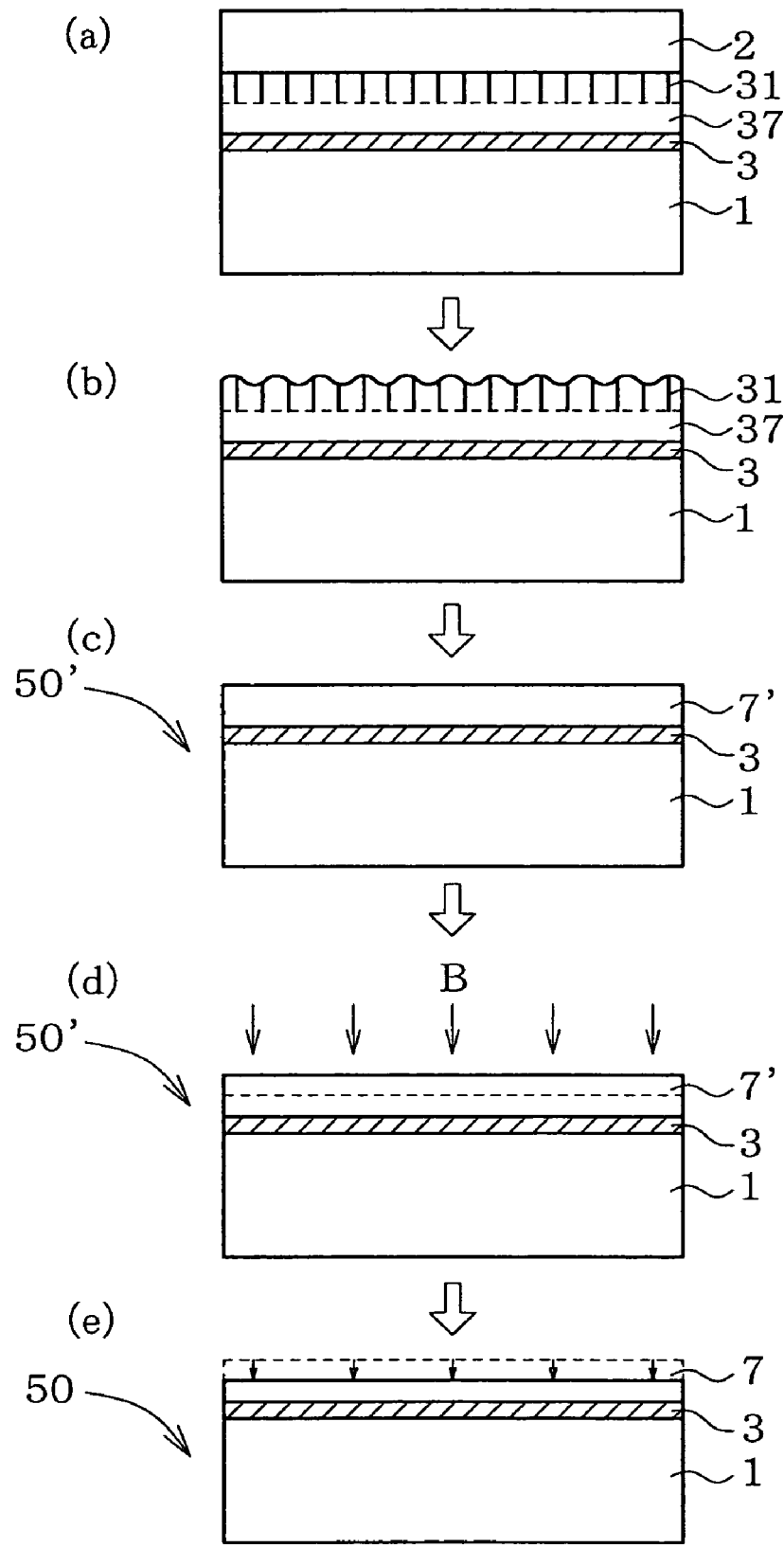
FIG. 6 is a drawing explaining process steps for an exemplary case where the first thinning step is carried out by ELTRAN process.

It is also allowable to carry out the first thinning step by the publicly-known ELTRAN process. FIG. 6 shows an exemplary case. First, as shown in process step (a), a porous silicon layer 31 is formed by publicly-known anodization treatment on a first main surface side of the bond wafer 2, and a silicon epitaxial layer 37, which is intended for becoming the SOI layer, is grown on the porous silicon layer 31 by vapor-phase epitaxy. Next on the first main surface of the silicon epitaxial layer 37, bonding annealing against the base wafer 1, while placing the silicon oxide film 3 in between, is carried out. Next, as shown in process step (b), the bond wafer 2 is then removed by grinding in a portion thereof which resides on the side closer to the second main surface (on the side opposite to the bonding surface) than the porous silicon layer 31, or by delamination by jetting a liquid to the porous layer. Next, as shown in process step (c), the residual porous silicon layer is selectively etched off using an etching solution such as hydrofluoric acid/hydrogen peroxide (typically 1:5 by volume ratio), to thereby obtain the SOI wafer 50' having the SOI layer 7'. The succeeding process steps (d) and (e) are same as those shown in FIG. 2.

SECOND EMBODIMENT

Figure 7:
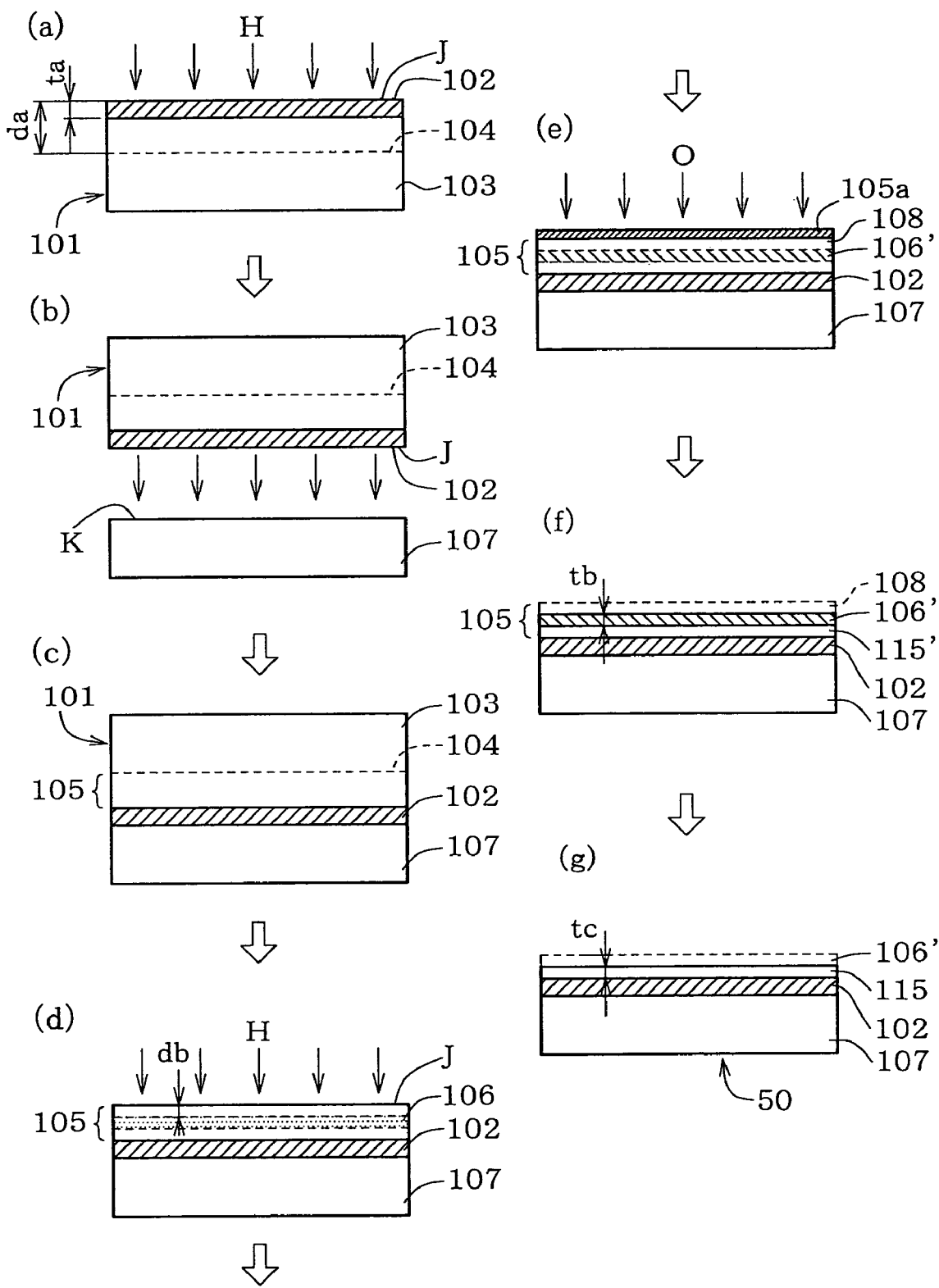
FIG. 7 is a drawing explaining fabrication process steps of an SOI wafer according to a second embodiment of this invention.

FIG. 7 explains a basic embodiment of the method of fabricating an SOI wafer according to the second embodiment of this invention. First, a base wafer 107 as a first silicon single crystal substrate shown in process step (b) and a bond wafer 101 as a second silicon single crystal substrate shown in process step (a) are obtained. As shown in process step (a), the bond wafer 101 herein has, formed on a first main surface J side thereof, a silicon oxide film 102 as an insulating film. The silicon oxide film 102 can typically be formed by thermal oxidation such as wet oxidation, where it is of course allowable to adopt other methods such as CVD (Chemical Vapor Deposition). Thickness of the silicon oxide film 102 ta is typically set to 50 nm to 2 µm or around, considering that it is used as an insulating layer typically in MOS-FET or the like.

Then, as shown in process step (a), the first main surface J of the bond wafer 1, or the main surface J on which the silicon oxide film 102 is formed in this embodiment, is irradiated with hydrogen ion beam so as to implant hydrogen ion, to thereby form a delaminable ion-implanted layer 104. The delaminable ion-implanted layer 104 is preferably formed so that the peak hydrogen concentration is found at a position (first depth position da) within a range from 100 to 2,000 nm deep from the surface of the silicon oxide film 102 in measurement of the depth profile of hydrogen concentration of the wafer. The first depth position da corresponds to a sum of the thickness of the bonded silicon single crystal film 105 (described later) and the thickness of the silicon oxide film 102. The first depth position da less than 100 nm will fail in obtaining the bonded silicon single crystal film 105 having a sufficient thickness, and exceeding 2,000 nm will demand an ion implantation apparatus extremely raised in the energy. In an exemplary case where the average thickness of the SOI layer 115 (process step (g)) to finally be obtained is set to 10 to 50 nm or around, the delaminable ion-implanted layer 104 is preferably formed so that the peak hydrogen concentration is found at a position 100 to 1,000 nm deep in measurement of the depth profile of hydrogen concentration of the wafer (where, for the case where the surface has the silicon oxide film 102 formed thereon, the depth is expressed as excluding the silicon oxide film 102). Depth of ion implantation da is adjustable by ion energy (acceleration voltage), and in an exemplary case where hydrogen ion is used and thickness of the silicon oxide film ta is set to 50 nm, the ion implantation energy for forming the delaminable ion-implanted layer 104 is preferably adjusted from 10 keV to 60 keV or around.

For the purpose of ensuring an easy and smooth delamination, amount of implanted hydrogen ion (dosage) is preferably adjusted to $2 \times 10^{16}/cm^2$ to $1 \times 10^{17}/cm^2$. The dosage less than $2 \times 10^{16}/cm^2$ will fail in normal delamination, and exceeding $1 \times 10^{17}/cm^2$ will increase the process time due to an excessively increased dosage, and inevitably degrade the production efficiency. It is also allowable to form a delaminable ion-implanted layer 104 by implantating helium ion or argon ion in place of hydrogen ion.

The bond wafer 101 having the delaminable ion-implanted layer 104 thus formed therein and the base wafer 107 are then cleaned using a cleaning liquid. Then as shown in process step (b), both wafers 101, 107 are stacked on the side the silicon oxide film 102 is formed (i.e., on the first main surface J, K sides), and bonded. Then as shown in process step (c), the resultant stack is annealed at a temperature as low as 400 to 600° C., by which the bond wafer 101 causes delamination nearly at the position of concentration peak of the aforementioned delaminable ion-implanted layer 104, and the residual portion on the base wafer 107 side will become the SOI layer 105 (aforementioned bonded silicon single crystal film) (delamination step). It is to be noted that, in some cases, the delaminating annealing is omissible by raising the dosage at forming a delaminable ion-implanted layer 104, or preliminarily activating the surface to be bonded by plasma treatment. The residual bond wafer portion 103 after the delamination can be recycled after re-polishing the delamination surface.

Next, as shown in process step (d), a etch-stoppable, ion-implanted layer 106 is formed by implanting ion from the first main surface J of the delaminated SOI layer 105. The etch-stoppable, ion-implanted layer 106 is preferably formed so that the peak position of the hydrogen concentration falls on a depth position db ranging from 30 to 300 nm. Ion implantation energy for forming the etch-stoppable, ion-implanted layer 106 at the depth position db is preferably adjusted to 3 keV to 35 keV or around for the case where hydrogen ion is used. It is also preferable herein, similarly to the case of the aforementioned ion implantation of boron, to carry out high-temperature annealing at 1,100 to 1,300° C. in a hydrogen gas or an inert gas such as argon gas, or in a mixed gas of these gases, prior to the ion implantation, to thereby improve the surface roughness.

Ion implantation dosage for the formation of the etch-stoppable, ion-implanted layer 106 is preferably adjusted to $1 \times 10^{15}/cm^2$ to $4 \times 10^{16}/cm^2$, which is smaller than the ion implantation dosage for the formation of the delaminable ion-implanted layer. The dosage less than $1 \times 10^{15}/cm^2$ will result in only an insufficient formation of damage for forming the etch stop layer 106' described later (process step (e)), and will fail in obtaining the high-oxygen-concentration layer having a sufficient etch stop effect. The dosage exceeding $4 \times 10^{16}/cm^2$ will result in a undesirable delamination of the bonded silicon single crystal film 105 at the etch-stoppable, ion-implanted layer 106.

Ion species for forming the etch-stoppable, ion-implanted layer 106 may be selected depending on the methods of producing the etch stop layer 106' composed of the high-oxygen-concentration layer. Hydrogen ion (helium ion or argon ion also available) is used in the process step shown in FIG. 7. The ion species mainly acts as forming crystal defect (damage) for trapping oxygen in the bonded silicon single crystal film 105.

Next, as shown in process step (e), an etch stop layer 106' having an oxygen concentration higher than that of the peripheral area is formed in the delaminated SOI layer 105 based on the etch-stoppable, ion-implanted layer 106 (etch stop layer forming step). This embodiment adopts a sort of internal oxidation by which oxygen is diffused from the surface of the delaminated SOI layer 105 towards the etch-stoppable, ion-implanted layer 106, to thereby raise the oxygen concentration of the etch-stoppable, ion-implanted layer 106 and form the etch stop layer 106'. According to this method, by forming a predetermined concentration of crystal defect in a form of the etch-stoppable, ion-implanted layer 106 in a concentrated manner by ion implantation of hydrogen ion (or helium ion or argon ion), oxygen diffused from the surface of the wafer is trapped in crystal defect formed on the etch-stoppable, ion-implanted layer 106, and this method makes it possible to readily form the etch stop layer 106' composed of a high-oxygen-concentration layer.

In the etch stop layer forming step of the above-described method can proceed the oxygen diffusion step specifically by annealing in an oxygen-containing atmosphere. Available examples of the oxygen-containing atmosphere include oxygen gas atmosphere, and gas atmospheres such as being composed of oxygen-mixed gas in which nitrogen or argon is mixed with oxygen, and a gas composed of molecules of oxygen-containing compound (e.g., steam).

The higher the annealing temperature rises, the faster the oxygen diffusion rate becomes, and this can accelerate the formation of the etch stop layer 106'. A too high annealing temperature, however, result in growth of the crystal defect (e.g., Oxygen-induced Stacking Fault) in the etch-stoppable, ion-implanted layer 106 so as to penetrate the SOI layer 105. Considering these points, the annealing temperature for oxygen diffusion is preferably set in a range from 700 to 1,000° C., both ends inclusive.

Figure 8:
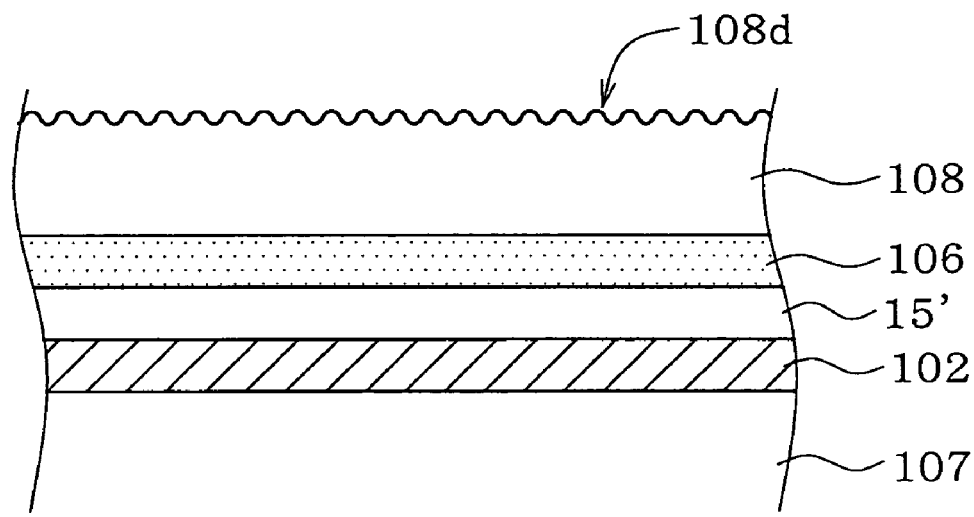
FIG. 8 is a drawing schematically showing an exemplary case of removal of a damaged layer after the delamination process.
Figure 8:
Figure 8:
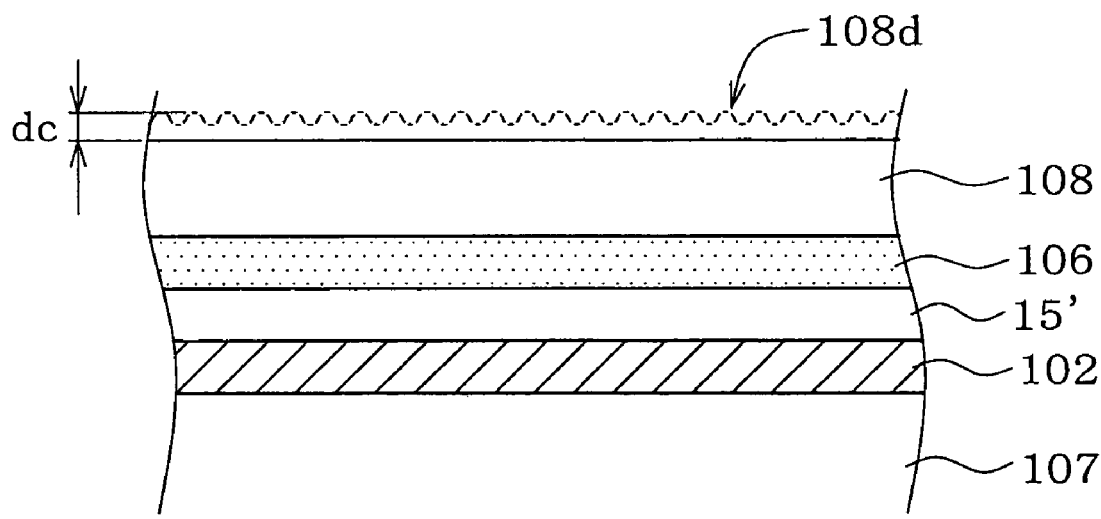

In some cases the topmost surficial portion of the delaminated SOI layer 105 may have an ion-implantation-induced damaged layer 108d remaining thereon as shown in FIG. 8. In this case, the annealing temperature for oxygen diffusion set to a relatively high level as described in the above may make the crystal defect more likely to grow from the damaged layer 108d, and more likely to cause non-conformities such as penetration of the SOI layer. The non-conformities will be less likely to cause if the topmost surficial portion of the delaminated SOI layer 105 is etched off prior to the oxygen diffusion step. In this case, the etching depth dc only as much as just removing the damaged layer 108d will be sufficient enough, and is appropriately set to 50 to 150 nm or around, for example. More specifically, the etching can be proceeded based on chemical etching such as mixed-acid etching using hydrofluoric acid/nitric acid or alkali etching using KOH or NaOH, or vapor-phase etching such as ion etching. It is also possible to preliminarily carry out the etching prior to the ion implantation step for forming the etch-stoppable, ion-implanted layer 106.

This embodiment does not adopt the touch polishing for removing the damaged layer 108d, unlikely to the conventional process. This consequently eliminates fears of considerably degrading the thickness distribution of the delaminated SOI layer 105 after the delamination, and it can be said that the etching depth for removing the damaged layer 108d can more readily be secured.

The oxygen diffusion annealing can be carried out in a singular manner, but may also be used for annealing for other purposes. For example, to obtain a final form of the SOI wafer, the delamination step must be followed by the bonding annealing for tightly bonding the first substrate and the bonded silicon single crystal film (in this embodiment, bonding annealing for tightly bonding the delaminated SOI layer 105 and base wafer (first substrate) 107 while placing the silicon oxide film 102 in between). Although it is not impossible to use the bonding annealing, generally proceeded in a temperature range of as high as 1,000 to 1,300° C., also as the oxygen diffusion annealing, it is more preferable to set temperature of the oxygen diffusion annealing slightly lower than in the bonding annealing, in view of preventing growth of the crystal defect in the etch-stoppable, ion-implanted layer 106 or broadening of the resultant etch stop layer 106 as described in the above. For example, prior to the bonding annealing, thermal oxidation for surface protection of the bonded silicon single crystal film carried at a lower temperature (700 to 1,000° C.) is preferable also as the oxygen diffusion annealing. In this process, the delaminated SOI layer 105 will have formed thereon a protective oxide film 105a, as shown in process step (e) in FIG. 7.

The etch stop layer 106' once formed as a high-oxygen concentration layer is finally removed, so that it is not necessary to have an excellent insulating property as owned by the silicon oxide film 102. It is therefore enough for the etch stop layer 106' to only exhibit the etching termination function, and the formation thickness tb thereof (process step (f) in FIG. 7) is preferably set to 2 nm to 50 nm. The formation thickness less than 2 nm may result in only an insufficient etching termination function, and exceeding 50 nm may tends to result in elongation of the oxygen diffusion processing.

The etch stop layer 106' must be able to certainly prevent the etching from advancing towards the underlying silicon layer which must finally be remained as the SOI layer 115. For example, as shown in (a) of FIG. 9, any foreign matters such as particle P adhered on a surface J' of the delaminated SOI layer 105, which is placed on the ion implantation side in the formation of the etch-stoppable, ion-implanted layer 106, may inhibit the ion implantation at the site of adhesion, and may cause a large number of pinholes in the resultant etch stop layer, through which the etching solution may infiltrate to thereby erode the underlying silicon layer. It is effective in this case to adopt a method in which the ion implantation to the surface J' of the delaminated SOI layer 105 and cleaning of the surface J' are alternately repeated to thereby attain a predetermined amount of dosage. More specifically, as shown in (b) of FIG. 9, repetitive ion implantation while removing the foreign matters such as the particle P by cleaning can extremely reduce possibility of re-adhesion of the particle P at the absolutely same site on the wafer surface after the cleaning, and this is successful in largely decrease the probability of pinhole generation.

Figure 9:
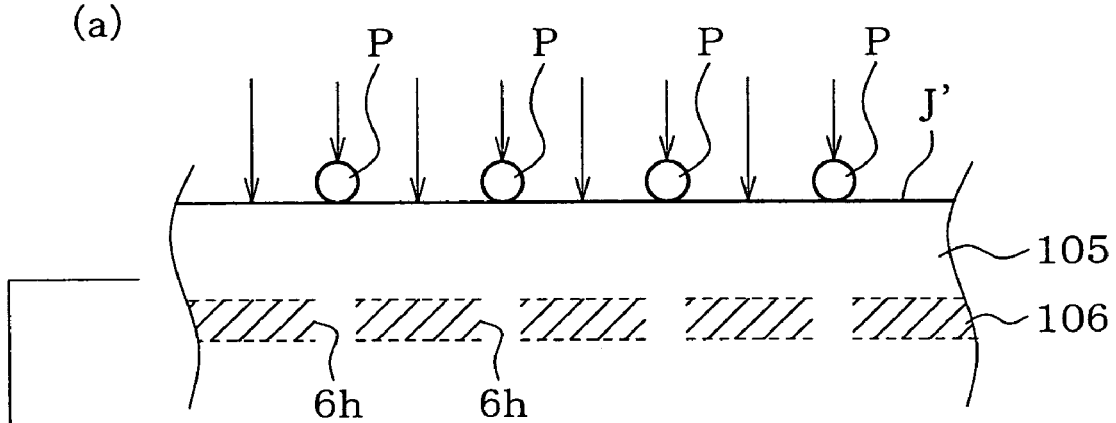
FIG. 9 is a drawing explaining influences of particles on the etch stop layer, and countermeasures therefor.
Figure 9:
Figure 9:
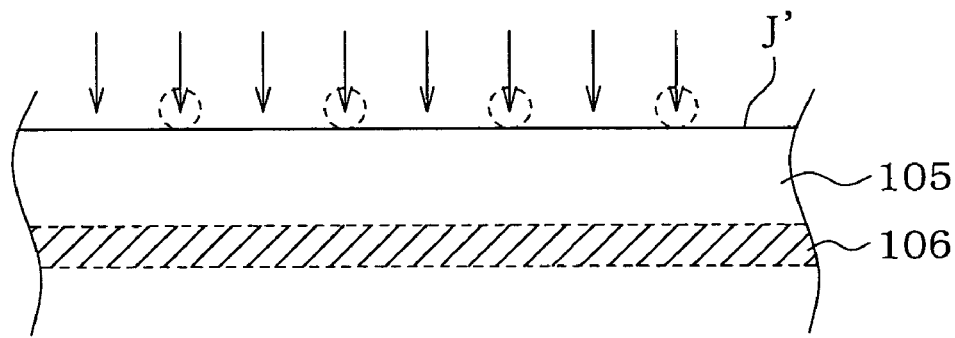
Figure 9:
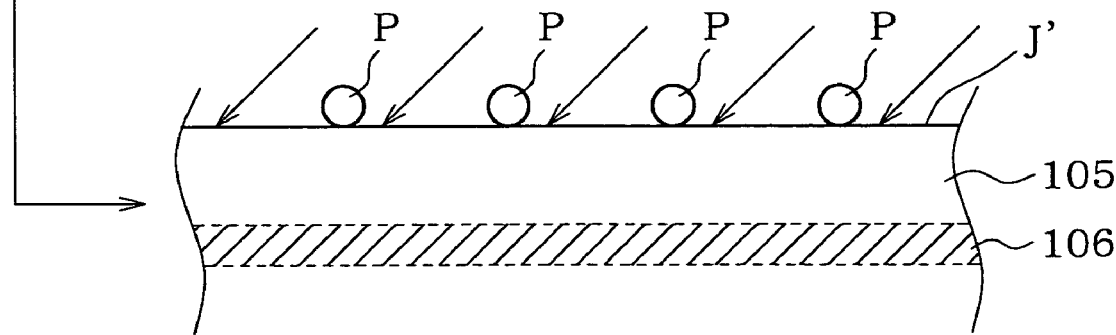

Also as shown in (c) of FIG. 9, it is also allowable to adopt a method of repetitively carrying out ion implantation to the surface J' of the delaminated SOI layer 105, in place of the cleaning, while varying the angle of implantation. That is, an oblique incidence of the ion beam with respect to the surface J' can allow the beam to get under the particle P. By varying the angle or direction of ion implantation, the ion implantation can be proceeded while moving shadowed area of the particle P on the surface J'. This successfully reduces the un-implanted area and therefore considerably reduces the probability pinhole generation.

After the etch stop layer 106' is thus formed, as shown in process step (f) in FIG. 7, a portion 108 of the delaminated SOI layer 105 more closer to the surface than the etch stop layer 106' is selectively etched based on difference in the oxygen concentration, to thereby thin the delaminated SOI layer 105. The etching solution used herein can be an alkaline solution, such as an aqueous solution of NaOH, KOH or TMAH (Tetramethyl ammonium hydroxide).

The etch stop layer 106' is formed based on the etch-stoppable, ion-implanted layer 106 as described in the above. The etch-stoppable, ion-implanted layer 106, formed at a shallow position, corresponding to the average thickness tc of the SOI layer 115 having a thickness of 10 to 50 nm or around, is less causative of variation in the depth of ion implantation. The etch stop layer 106' will therefore have an oxygen concentration profile characterized by a relatively sharp form and a constant depth of peak position. This successfully makes it possible to obtain the SOI layer 115 having an excellent distribution in the film thickness not only on the intra-wafer basis but also on the inter-wafer basis corresponding to the oxygen concentration profile. More specifically, despite that the average thickness tc of the SOI layer 115 is set to as ultra-thin as 10 to 50 nm or around, it is made possible to secure a uniformity of the obtained SOI layer 115 in the thickness of typically 0.4 nm or below on the basis of intra-wafer standard deviation of the thickness, and it is made even possible, as shown in (d) of FIG. 2 to secure a value of 2 nm or below on the basis of inter-wafer standard deviation σ2 of the thickness tc (=t1, t2, t3) observed in the wafers having the same specification. In particular for the case where the SOI layer 7 is ultra-thinned to as small as 20 nm or below (e.g., 10 nm), intra-wafer and inter-wafer variations in the film thickness can successfully be reduced to a level enough for allowing the practical use.

The protective oxide film 105a is then removed using hydrofluoric acid, the thinning step based on the selective etching is carried out, and further as shown in process step (g) in FIG. 7, the etch stop layer 106' remaining on the SOI layer 115 is removed by etching to thereby obtain the SOI wafer 50. The etch stop layer 106' is composed of a high-oxygen-concentration layer, typically of a silicon oxide layer, and can readily be etched off with hydrofluoric acid. It is also allowable to remove the etch stop layer 106' by dry etching (vapor-phase etching).

After completion of the thinning step (after the etch stop layer 106' is removed), it is allowable to carry out flattening annealing for further flattening the surface of the SOI layer 115. The flattening annealing can be proceeded in an inert gas such as argon gas, hydrogen gas, or mixture of these gases at 1,100 to 1,300° C., which can be used also as the abobe-described bonding annealing. More specifically, the annealing can be carried out not only in a heater-heating-type annealing furnace such as general batch-type vertical furnace and horizontal furnace, but also in a single-wafer-processing-type RTA apparatus which can complete the annealing within several seconds to several minutes or around using lamp heating.

Figure 10:
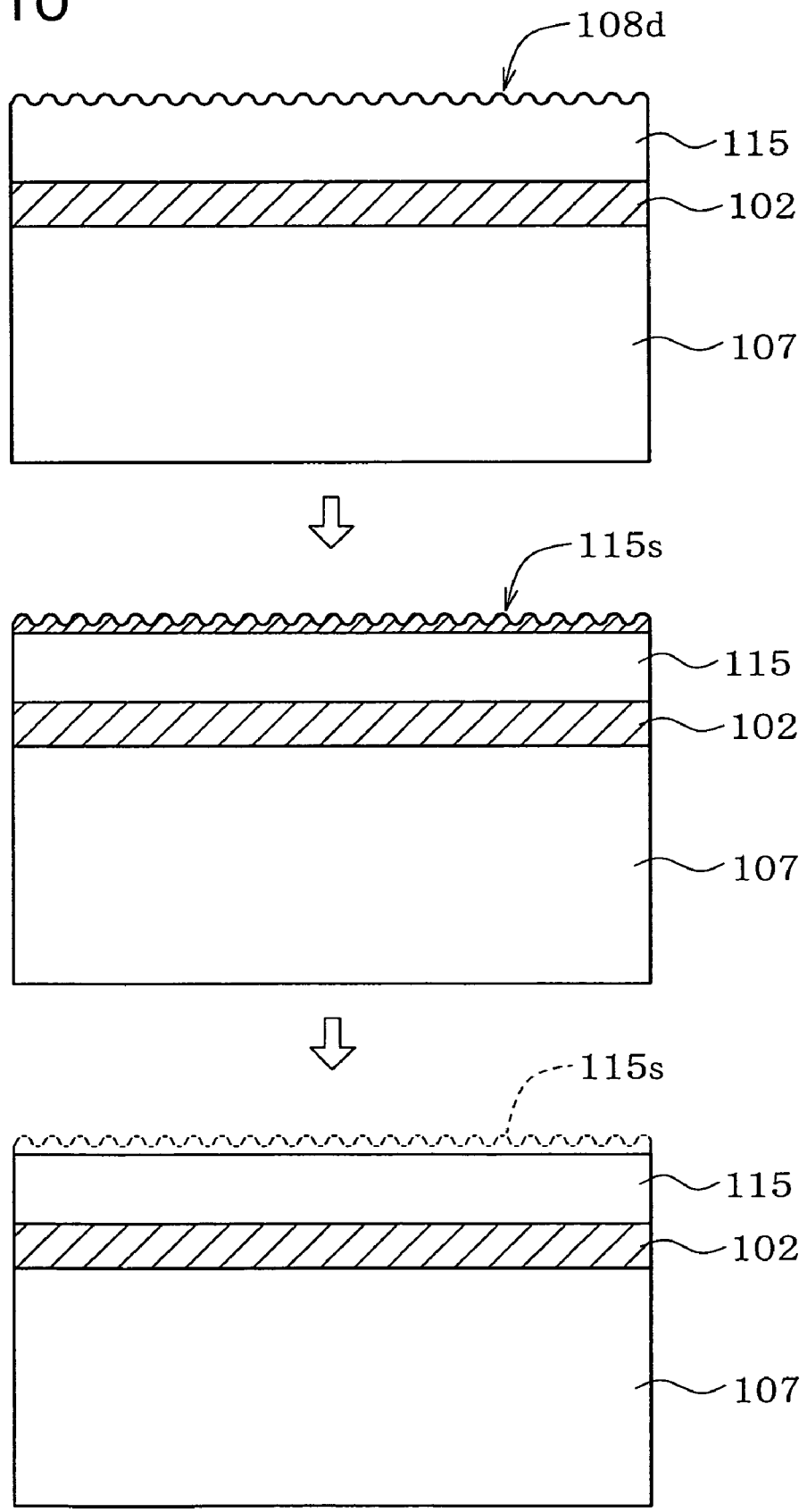
FIG. 10 is a drawing schematically showing an exemplary case of removal of the damaged layer based on the etch-stoppable, ion-implanted layer.

Because the etch stop layer 106' is formed based on the etch-stoppable, ion-implanted layer 106, a slight amount of damaged layer 108d caused by the ion implantation may remain even after the removal by the above-described etching using hydrofluoric acid or the like, as shown in FIG. 10. Sacrificial oxidation will now be successful in effective removing the damaged layer 108d, in which the topmost surficial portion of the SOI layer 115 is subjected to thermal oxidation, after the thinning step, and a resultant thermal oxide film 115s is etched off using hydrofluoric acid or the like. Because the damaged layer 108d is formed in reflection of the etch-stoppable, ion-implanted layer 106 having a small ion implantation dosage and implantation depth, the thermal oxide film 115s will be sufficient if it is formed in a thickness only as small as 5 nm to 100 nm to remove the damaged layer 108d. This successfully minimizes influences of the formation and removal of the thermal oxide film 115s on the distribution of thickness of the SOI layer 115. It is also allowable to carry out this type of sacrificial oxidation for the purpose of finely adjusting the thickness of the final SOI layer 115.

Figure 11:
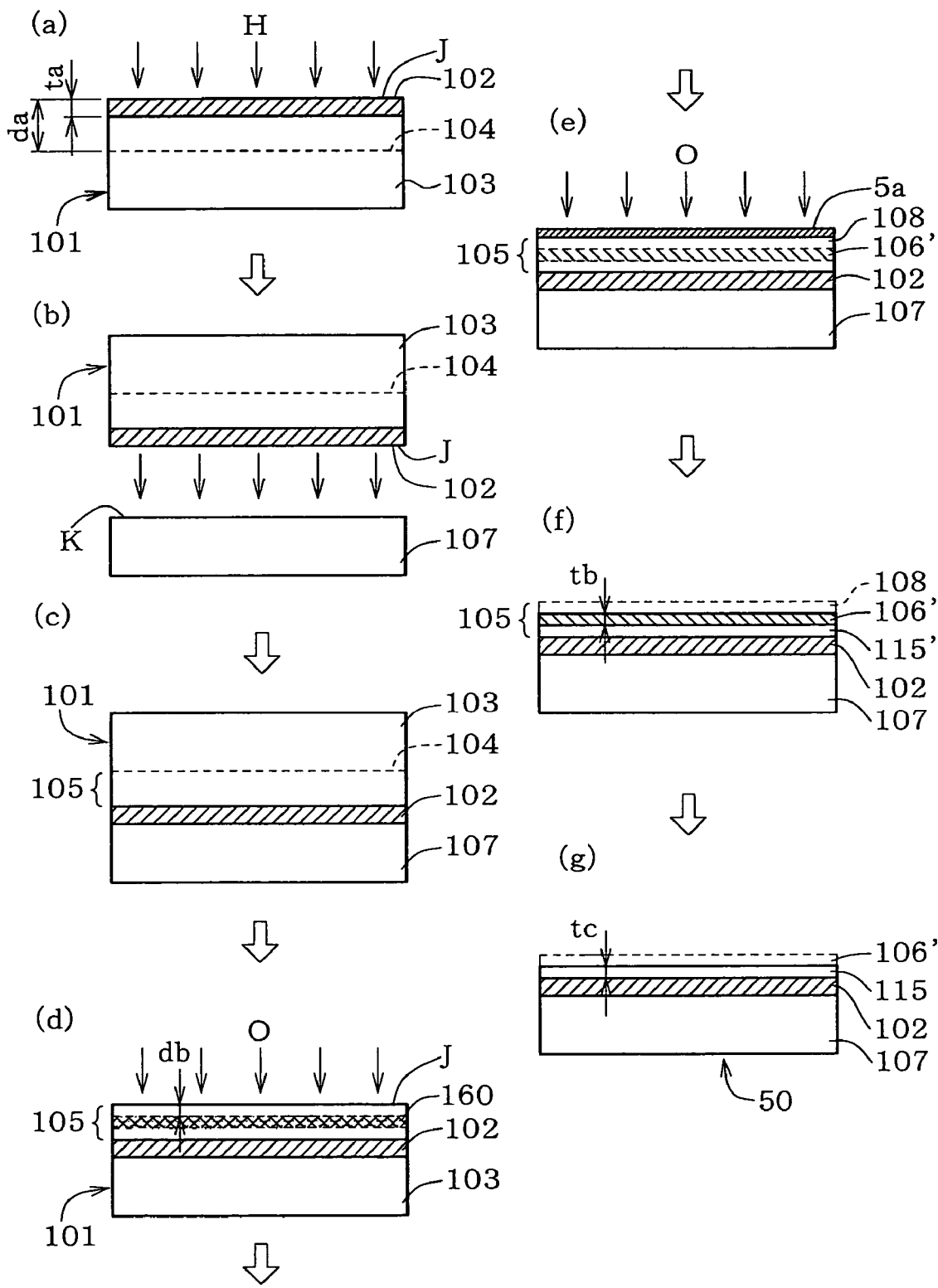
FIG. 11 is a drawing explaining a modified example of the method of fabricating the SOI wafer shown in FIG. 7.
Figure 12A:
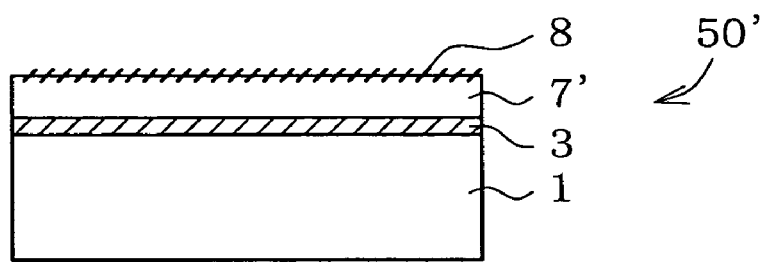
FIG. 12A is a first drawing showing a problem in a first conventional method of fabricating an SOI wafer.
Figure 12B:
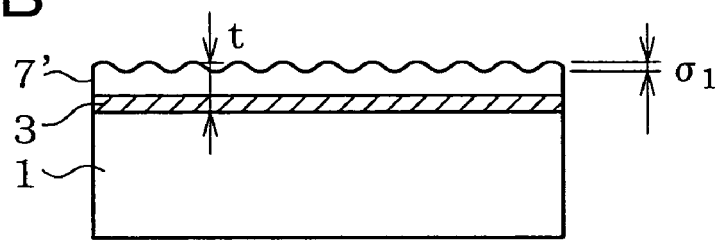
FIG. 12B is a second drawing of the same.
Figure 12C:
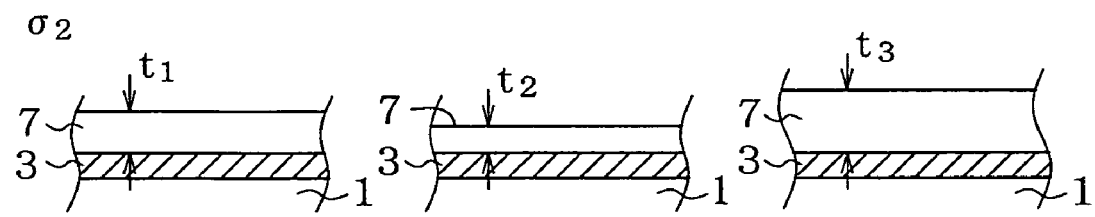
FIG. 12C is a third drawing of the same.
Figure 13A:
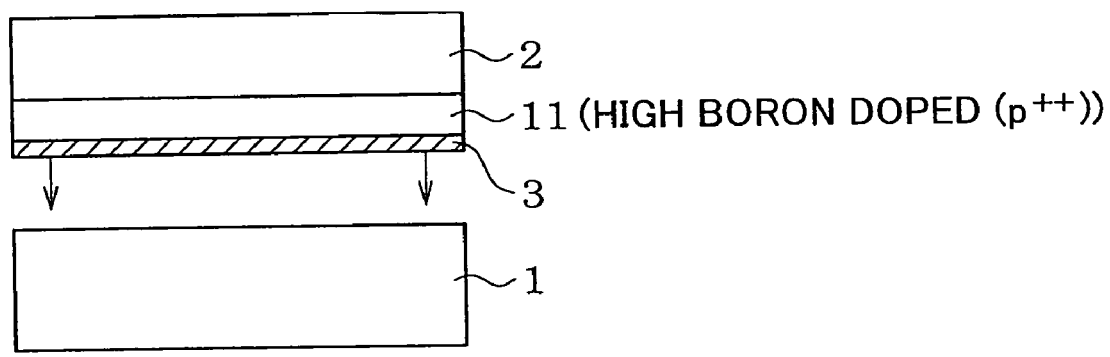
FIG. 13A is a first drawing showing a problem in a second conventional method of fabricating an SOI wafer.
Figure 13B:
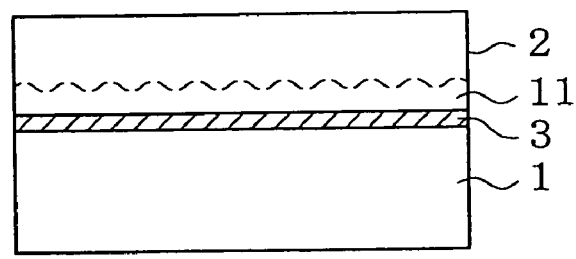
FIG. 13B is a second drawing of the same.

In the etch-stoppable-layer forming step, it is also allowable to form, using oxygen ion, the etch-stoppable, ion-implanted layer in the bonded silicon single crystal film. FIG. 11 shows an exemplary process therefor. Process steps (a) to (c) are same as process steps (a) to (c) in FIG. 7. In process step (d), the etch-stoppable, ion-implanted layer 160 is formed using oxygen ion. The etch-stoppable, ion-implanted layer 160 is preferably formed so as to have the peak position of oxygen concentration at a position of 50 nm to 500 nm (second depth position db). Ion implantation dosage is preferably adjusted to $1 \times 10^{15}/cm^2$ to $4 \times 10^{17}/cm^2$.

This method is advantageous in that the etch-stoppable, ion-implanted layer 160 can directly be formed as the high-oxygen-concentration layer. It is, however, preferable to anneal the etch-stoppable, ion-implanted layer 160 in order to strengthen chemical bond between silicon and oxygen, to thereby obtain the etch stop layer excellent in the etching selectivity. The annealing is preferably carried out within a temperature range from 900 to 1,350° C. The temperature lower than 900° C. will result in only an limited improving effect of the etching selectivity, and exceeding 1,350° C. will raise problems in metal contamination and generation of slip dislocation. The annealing can typically be carried out, as shown process step (e), at 900 to 1,000° C. similarly to as in the oxygen diffusion annealing shown in FIG. 7 in a singular manner. The annealing atmosphere may be an inert gas (Ar) atmosphere, or may be an oxygen-containing atmosphere in order to further densify oxygen in the etch-stoppable, ion-implanted layer 160 (so-to-say additional diffusion treatment of oxygen). On the other hand, it is also allowable to use the annealing also for the bonding annealing which comes after the delamination step, or for the aforementioned surface-protective oxidation annealing which precedes the bonding annealing and is carried out at a lower temperature than in the bonding annealing. In this case, it is also allowable to omit the oxygen diffusion annealing shown in process step (e) in FIG. 11. Process steps (f) and thereafter are same as those shown in FIG. 7.

In order to raise density of the crystal defect capable of trapping oxygen, it is also allowable to form a preliminary ion-implanted layer using at least one of hydrogen ion, rare gas ion and silicon ion, and further implant oxygen ion into the preliminary ion-implanted layer to thereby form the etch-stoppable, ion-implanted layer. This may further be followed by oxygen diffusion annealing.

In the etch stop layer forming step, it is still also allowable to form the etch-stoppable, ion-implanted layer in the bonded silicon single crystal film using germanium ion. The etch-stoppable, ion-implanted layer herein is composed of silicon-germanium layer, and can immediately function as the etch stop layer for protecting the silicon layer from being etched by a specific etching liquid. An appropriate example of the etching liquid for selectively etching silicon layer while being not affective to the silicon-germanium layer is a mixed solution of KOH, $K_2Cr_2O_7$ and propanol (reference literature; Applied Physics Letters, 56 (1990), 373–375). The etch stop layer composed of the silicon-germanium layer can be removed using an etching liquid capable selectively etching SiGe over Si, and specific examples thereof include a mixed solution of HF, $H_2O_2$ and $CH_3COOH$ (reference literature; Journal of Electrochemical Society, 138 (1991) 202–204). It is also allowable to carry out the selective etching by dry etching.

The invention claimed is:

1. A method of fabricating an SOI wafer comprising:
   a bonding step that comprises:
      providing a first substrate,
      providing a second substrate that comprises a silicon single crystal wafer,
      forming an insulating film on a first main surface of at least one of the first substrate and the second substrate, and
      bonding the first substrate to the second substrate with the insulating film between the first substrate and the second substrate;
   a first thinning step that comprises reducing a thickness of the second substrate to a first thickness to obtain an SOI layer bonded to the first substrate;
   a high-temperature annealing step that comprises annealing the SOI layer bonded to the first substrate at a temperature in a range of 1,000 to 1,3000° C.;
   an etch-stoppable, ion-implanted-layer forming step that is conducted after said high-temperature annealing step and that comprises:

performing ion implantation from a surface of the SOI layer to form an etch-stoppable, ion-implanted layer by ion implantation having a concentration peak at a predetermined depth from the surface of the SOI layer;

optionally forming an etch-stop layer from the etch-stoppable, ion-implanted layer; and a second thinning step that comprises selectively etching the SOI layer bonded to the first substrate to obtain an SOI wafer having an SOI layer with a second thickness;

wherein the second thickness is smaller than the first thickness.

2. The method of fabricating an SOI wafer as claimed in claim 1, wherein:

the etch-stoppable, ion-implanted-layer forming step comprises implanting boron ion from the surface of the SOI layer to form a high-boron-concentration layer, and selectively etching the SOI layer is based on difference in the boron concentration.

3. The method of fabricating an SOI wafer as claimed in claim 2, further comprising a step of annealing the SOI wafer for activating boron, the step coming between the high-boron-concentration-layer forming step and the second thinning step.

4. The method of fabricating an SOI wafer as claimed in claim 3, further comprising a step of external-diffusion annealing to remove residual boron in the SOI layer, the step coming after the second thinning step.

5. The method of fabricating an SOI wafer as claimed in claim 2, further comprising a step of external-diffusion annealing to remove residual boron in the SOI layer, the step coming after the second thinning step.

6. The method of fabricating an SOI wafer as claimed in claim 1, wherein forming the etch-stop layer comprises allowing oxygen to diffuse towards the etch-stoppable, ion-implanted layer to raise oxygen concentration of the etch-stoppable, ion-implanted layer to form a high-oxygen-concentration layer that an oxygen concentration higher than that of a peripheral area.

7. The method of fabricating an SOI wafer as claimed in claim 6, wherein performing ion implantation from the surface of the SOI wafer comprises implanting at least one ion selected from group consisting of hydrogen ion, rare gas ion, silicon ion and oxygen ion.

8. The method of fabricating an SOI wafer as claimed in claim 7, wherein allowing oxygen to diffuse towards the etch-stoppable, ion-implanted layer proceeds by annealing in an oxygen-containing atmosphere.

9. The method of fabricating an SOI wafer as claimed in claim 6, wherein allowing oxygen to diffuse towards the etch-stoppable, ion-implanted layer proceeds by annealing in an oxygen-containing atmosphere.

10. The method of fabricating an SOI wafer as claimed in claim 1, wherein:

the bonding step comprises forming a delaminable ion-implanted layer by implanting at least either one of hydrogen ion and rare gas ion from the first main surface of the second substrate to form a concentration peak at a predetermined depth from the first main surface of the second substrate in terms of depth ion implantation profile to form a delaminable ion-implanted layer prior to bonding the first substrate to the second substrate with the insulating film between the first substrate and the second substrate; and the first thinning step comprises delaminating, at the ion-implanted layer, a bonded silicon single crystal film to obtain the SOI layer bonded to the first substrate.

11. The method of fabricating an SOI wafer as claimed in claim 10, further comprising etching the bonded silicon single crystal film to remove a topmost surficial portion of the bonded silicon single crystal film, prior to the etch-stoppable, ion-implanted layer forming step.

12. The method of fabricating an SOI wafer as claimed in claim 11, further comprising annealing the bonded silicon single crystal film is annealed in hydrogen gas, rare gas or mixed gas thereof in a temperature range of 1,100 to 1,300° C., prior to the etch-stoppable, ion-implanted layer forming step.

13. The method of fabricating an SOI wafer as claimed in claim 12, wherein performing ion implantation from the surface of the SOI layer comprises a smaller ion implantation dosage forming the delaminable ion-implanted layer.

14. The method of fabricating an SOI wafer as claimed in claim 11, wherein performing ion implantation from the surface of the SOI layer comprises a smaller ion implantation dosage than forming the delaminable ion-implanted layer.

15. The method of fabricating an SOI wafer as claimed in claim 10, further comprising annealing the bonded silicon single crystal film in hydrogen gas, rare gas or mixed gas thereof in a temperature range of 1,100 to 1,3000° C. prior to the etch-stoppable, ion-implanted layer forming step.

16. The method of fabricating an SOI wafer as claimed in claim 15, wherein performing ion implantation from the surface of the SOI layer comprises a smaller ion implantation dosage than forming the delaminable ion-implanted layer.

17. The method of fabricating an SOI wafer as claimed in claim 10, wherein performing ion implantation from the surface of the SOI layer comprises a smaller ion implantation dosage than forming the delaminable ion-implanted layer.

18. The method of fabricating an SOI wafer as claimed in claim 10, wherein the insulating film is a silicon oxide film.

19. The method of fabricating an SOI wafer as claimed in claim 10, wherein the first substrate is a silicon single crystal substrate.

20. The method of fabricating an SOI wafer as claimed in claim 1, wherein:

the bonding step comprises:
    forming a porous silicon layer on the first main surface side of the second substrate;
    forming, on the porous silicon layer, a silicon epitaxial layer by vapor-phase epitaxy; and
    bonding the surface of the silicon epitaxial layer to the first substrate; and
the first thinning step comprises:
    delaminating, at the porous silicon layer, the silicon epitaxial layer to form the SOI layer on the second substrate; and
    removing the porous silicon layer remaining on the silicon epitaxial layer by selective etching.

21. The method of fabricating an SOI wafer as claimed in claim 20, wherein the insulating film is a silicon oxide film.

22. The method of fabricating an SOI wafer as claimed in claim 20, wherein the first substrate is a silicon single crystal substrate.

23. The method of fabricating an SOI wafer as claimed in claim 1, wherein uniformity in the thickness of the SOI layer after the second thinning step is 0.4 nm or less on the basis of a standard deviation of the thickness observed in a single wafer, and 2 nm or less on the basis of a standard deviation of the thickness observed in the wafers having the same specification.

24. The method of fabricating an SOI wafer as claimed in claim 23, wherein, in the second thinning step, the SOI layer is thinned to the second thickness of 20 nm or less.

25. The method of fabricating an SOI wafer as claimed in claim 1, wherein the insulating film is a silicon oxide film.

26. The method of fabricating an SOI wafer as claimed in claim 1, wherein the first substrate is a silicon single crystal substrate.

* * * * *